United States Patent

Natsume

[19]

[11] Patent Number: 5,764,487
[45] Date of Patent: Jun. 9, 1998

[54] JUNCTION BLOCK WITH INTEGRAL PRINTED CIRCUIT BOARD AND ELECTRICAL CONNECTOR FOR SAME

[75] Inventor: Yoshihisa Natsume, W. Bloomfield, Mich.

[73] Assignee: Yazaki Corporation, Tokyo, Japan

[21] Appl. No.: 692,599

[22] Filed: Aug. 6, 1996

[51] Int. Cl.$^6$ ...................................... H01R 9/28
[52] U.S. Cl. ...................... 361/775; 174/72 B; 361/823; 439/76.2
[58] Field of Search .................. 174/72 B, 71 B, 174/68.2; 361/728, 736, 775, 804, 826, 822, 823, 637, 639, 644, 675; 439/76.2

[56] References Cited

U.S. PATENT DOCUMENTS

| | | | |
|---|---|---|---|
| 4,685,753 | 8/1987 | Isshiki et al. | 439/76.2 |
| 4,689,718 | 8/1987 | Mave et al. | 361/360 |
| 4,850,884 | 7/1989 | Sawai et al. | 439/76 |
| 4,869,675 | 9/1989 | Ogawa | 439/76 |
| 4,906,195 | 3/1990 | Kubota et al. | 439/76 |
| 4,915,637 | 4/1990 | Ogawa et al. | 439/76 |
| 5,403,193 | 4/1995 | Ito et al. | 439/34 |
| 5,466,161 | 11/1995 | Yumibe et al. | 439/66 |

FOREIGN PATENT DOCUMENTS 59-222016 10/1986 Japan.
63-42472 7/1988 Japan.

*Primary Examiner*—Donald Sparks
*Attorney, Agent, or Firm*—Young & Basile, P.C.

[57] ABSTRACT

An electrical junction block for an automotive vehicle comprises a housing containing a planar, multilayer busbar and a printed circuit board, the busbar and the printed circuit board being maintained in parallel and electrically insulated relationship to one another. A plurality of receptacles are formed on the exterior surfaces of the housing to receive mating electrical components such as fuses, relays, and wiring harness connectors. Electrical connection between the printed circuit board and the electrical components is via a plurality of printed circuit board connection terminals having first ends which make electrical contact with the face of the printed circuit board oriented toward the busbar and second ends which pass through holes in the busbar and then through apertures in the housing and into the receptacles. Each printed circuit board connection terminal comprises spacer plates which maintain the printed circuit board and the busbar a desired distance apart and a spring portion which makes electrical contact with the printed circuit board, deflecting slightly when the spacer plates are urged into contact with the printed circuit board.

13 Claims, 4 Drawing Sheets

JUNCTION BLOCK WITH INTEGRAL PRINTED CIRCUIT BOARD AND ELECTRICAL CONNECTOR FOR SAME

FIELD OF THE INVENTION

The present invention relates to an electrical junction block for the distribution of electrical power to various systems of an automotive vehicle, and more particularly to a junction block having an integral printed circuit board, and a specialized electrical terminal for use with the circuit board.

BACKGROUND OF THE INVENTION

Many automotive vehicles currently employ an electrical junction block for the distribution of electric power from the battery and alternator to the various electrical systems of the vehicle. One known type of junction block comprises a plastic housing which contains a busbar having a plurality of electrically conductive layers, each layer carrying a different level of electrical current. Terminals extending from the conductive layers of the busbar pass through openings in the housing to provide points of electrical connection with the various relays, fuses, wiring harnesses, and other components of the vehicle electrical system.

Many of the optional accessories available on automotive vehicles require an electronic circuit for their functioning. Examples of such systems are window defoggers, headlamp control units, and power window control units. Electronic circuitry for controlling one or more of these types of electrical systems is typically formed on a printed circuit board (PCB) contained within a separate module known as an electronic circuit unit. As taught in, for example, U.S. Pat. No. 4,915,637, such an electronic circuit unit mates with a receptacle formed on the exterior of the junction block housing. One or more busbar terminals extends from the housing and passes through a mating opening in the electronic circuit unit to make electrical contact with the circuit contained therein. The busbar terminal, or an extension thereof, then extends completely through the electronic circuit unit and protrudes from the opposite side to provide for electrical connection with wires running to the electrical system or systems controlled by the electronic circuit unit.

Electrical contact between the busbar terminal and the PCB contained within the electronic circuit unit is by means of a so-called "through terminal" soldered to the circuit traces on the PCB at a position adjacent to a terminal-receiving slot through the PCB. The busbar terminal projects through the slot and the through terminal before exiting the electronic circuit unit. The soldered connections between the through terminal and the PCB circuit traces add cost to the production of the PCB and are prone to cracking or breakage due to the forces applied when the electronic circuit unit is connected to or disconnected from the junction block. Also adding to the cost of the overall system is the fact that the busbar housed by the junction block must have, in addition to the conductive layers carrying the several different relatively high levels of current used to power the vehicle systems, an additional conductive layer to supply the low current required by the control circuitry on the PCB.

SUMMARY OF THE INVENTION

The present invention avoids the above-described drawbacks by providing an electrical junction block wherein the junction block housing encloses both a multi-layer busbar and a printed circuit board (PCB) in substantially planar relationship to one another. The busbar and the PCB are electrically insulated from one another, and both are electrically connectable with components external to the housing. By placing the PCB inside of the housing and supplying it with power from a source other than the busbar, the separate electronic control unit and its soldered "through terminal" structure is eliminated, the number of components and electrical interfaces required to distribute power to the various electrical systems of a vehicle is reduced, and the number of conductive layers making up the busbar is reduced since the busbar need not provide electrical power to the PCB.

In the preferred embodiment of the invention, circuit traces are formed on a first face of the PCB oriented toward the busbar, and one or more PCB connection terminals are in electrical contact with the circuit traces and pass through holes or slots formed in the busbar before protruding from the housing for mating with fuses, relays, wiring harnesses or other vehicle electrical system components. This configuration allows such components which require connection with the electronic circuits of the PCB to be connected to the busbar side of the junction block, thus offering greater flexibility in the placement of the electrical components and the routing of electrical wiring connecting to the junction block.

According to a feature of the invention, the PCB connection terminals are pressure-connected to the circuit trace on the PCB rather than being soldered or otherwise more permanently connected. The pressure connection insures good electrical contact between the PCB connection terminal and the circuit trace and simplifies the manufacturing and assembly of the junction block.

The electrical junction block may also include one or more PCB connection terminals which contact circuit traces formed on the opposite second face of the PCB and extending therefrom through openings in the PCB side of the housing. This allows connections to be made with the PCB circuitry from either side of the junction block thereby increasing the design flexibility of the junction block and vehicle electrical system layout.

According to another feature of the invention, the end of the PCB connection terminal which makes contact with the PCB comprises a resilient spring member that deflects when the terminal is urged into contact with the PCB to achieve the pressure-connection therewith, the deflection generating a pre-determined level of force against the PCB. The spring member is designed to apply sufficient force to insure good electrical contact between the terminal and the PCB, yet not so much force as may damage the terminal or the PCB.

According to a further feature of the present invention, the end of the PCB connection terminal which contacts the PCB comprises spacer means for positioning between the PCB and the busbar to maintain a desired separation distance therebetween. The desired separation distance is slightly less than the length of the spring member in its undeflected condition. Accordingly, when the spacer means is in contact with the PCB and the busbar and maintaining them the desired distance apart, the spring member is compressed to its deflected condition. The proper dimensional relationship between the spacer means and the spring member insures that the spring member is deflected by an amount which produces the proper amount of pressure between the spring member and the circuit traces on the PCB.

These and other features, advantages, and objectives of the invention will be best understood from a reading of the following specification which, along with the attached drawings, describes an illustrative embodiment of the invention in detail.

DETAILED DESCRIPTION OF THE PREFERRED EMBODIMENT

Figure 1:
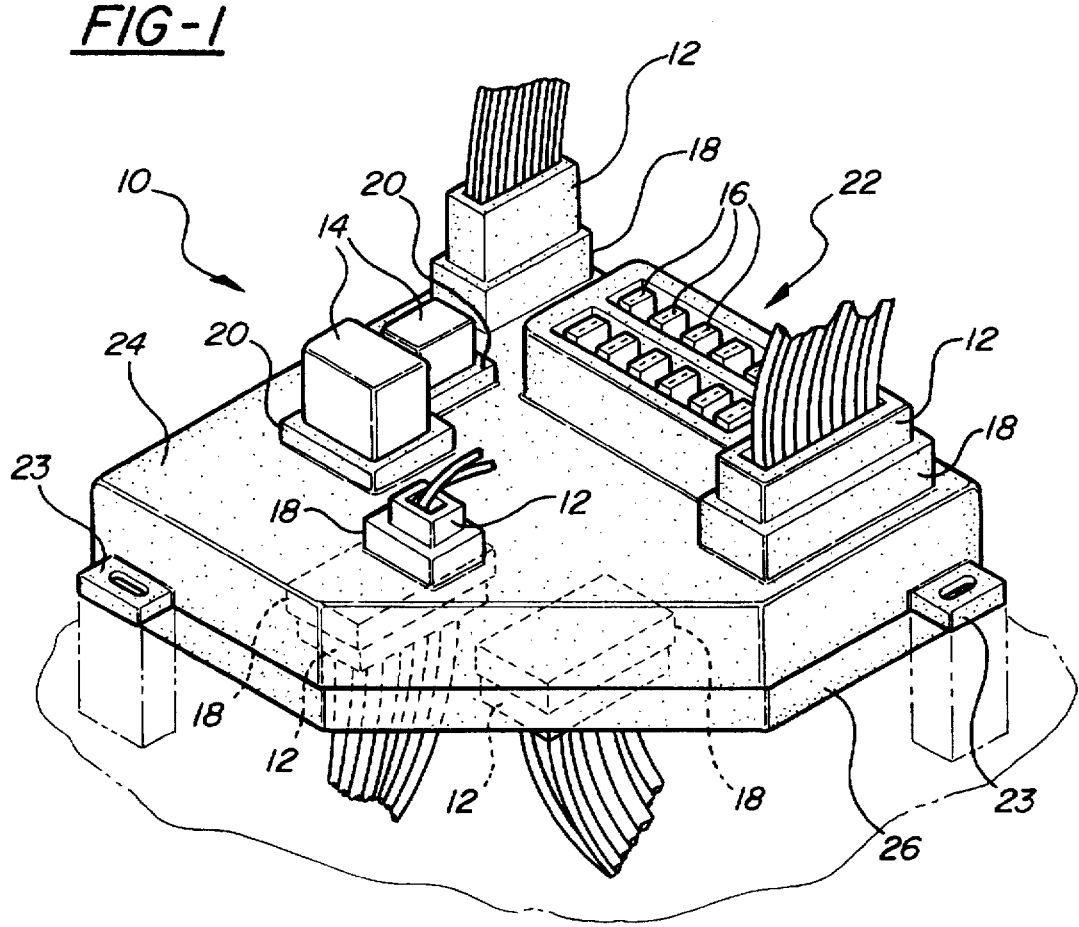
FIG. 1 is a perspective view of the upper surface of a junction block according to the present invention.

In FIG. 1, a junction block 10 according to the present invention is shown with a plurality of electrical components such as wiring connectors 12, relays 14, and fuses 16 operatively connected thereto, the components being respectively received by receptacles 18, 20, 22 formed on both the upper and lower surfaces of the junction block. Components 12, 14, 16 are associated with various electrical systems of an automotive vehicle (not shown) and junction block 10 provides means for electrical interconnection between them as necessary for proper functioning of the systems.

Junction block 10 is secured to the structure of the vehicle by passing threaded fasteners through mounting tabs 23, and is typically installed in a location relatively easily accessible from within the vehicle's passenger compartment, such as beneath the dash board, so that it may be serviced as necessary, for example to replace blown fuses.

Figure 2:
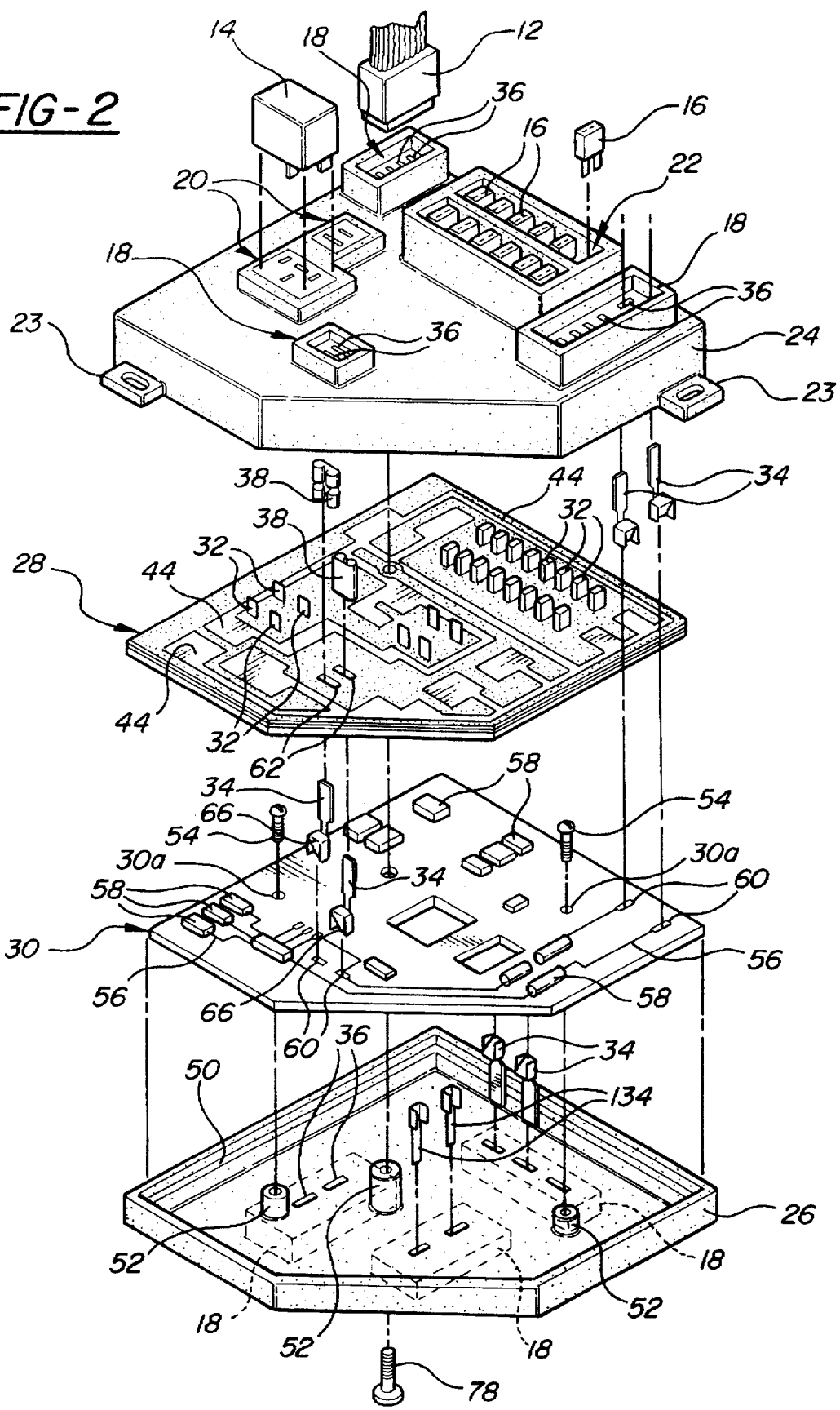
FIG. 2 is an exploded perspective view of the junction block of FIG. 1.

Referring to FIG. 2, junction block 10 comprises upper and lower housing segments 24, 26, a planar, multi-layer busbar 28, and a printed circuit board (hereinafter referred to by the abbreviation PCB) 30. Upper and lower housing segments 24, 26 fit together in mating fashion to enclose busbar 28 and PCB 30 and maintain them in spaced, substantially parallel relationship to one another.

Upper and lower housing segments 24, 26 are made of an electrically non-conductive material, and preferably are injection molded thermoplastic. Receptacles 18, 20, 22 are of varying size and shape as necessary to receive their respective mating components. The specific arrangement of receptacles 18, 20, 22 on the housing segments will vary depending on the requirements of the automobile electrical system, and the particular layout shown is not intended to limit the scope of the invention.

Figure 3:
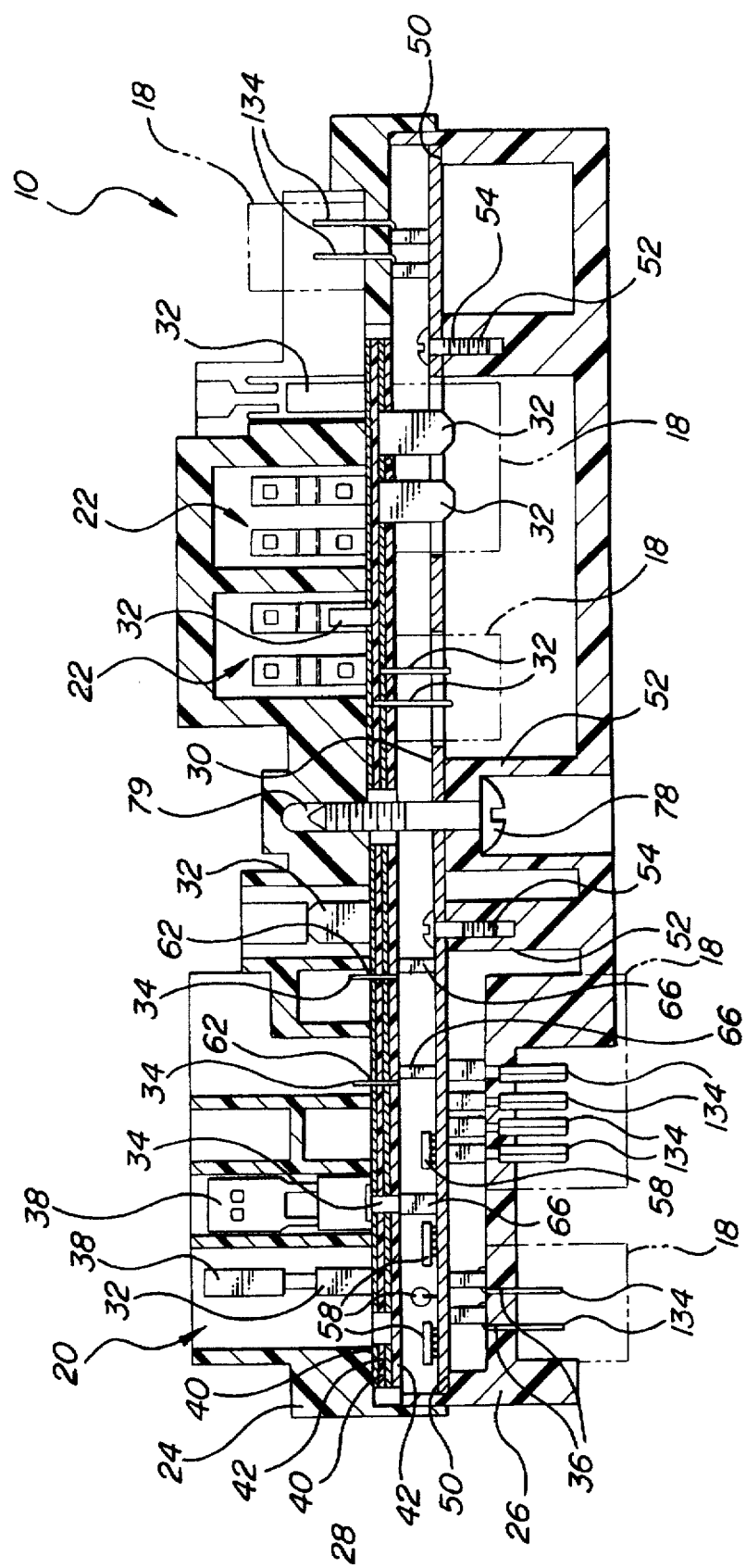
FIG. 3 is a cross sectional view of the junction block of FIG. 1.

As best seen in FIGS. 2 and 3, a plurality of busbar terminals 32 and printed circuit board connection terminals 34, 134 extend in both upward and downward directions from busbar 28 and PCB 30 to project into the receptacles via apertures 36. Some of receptacles 18, 20, 22 include a cavity to house terminal mating adapters 38, which are conductive elements for coupling together a male terminal 32, 34, 134 of the junction block and a male terminal of the mating wiring connector 12, relay 14, or fuse 16.

As best seen in FIG. 3, busbar 28 is positioned inside upper housing segment 24 to lie adjacent to and substantially parallel with the inner surface thereof. Busbar 28 comprises a plurality of conductive layers 40 separated by insulating layers 42. The depicted embodiment of the invention has two conductive layers, each carrying a different level of current, and two insulating layers 42, but any number of layers may be included as necessary for the supply of power to the various vehicle electrical systems. As is well known in the art, each conductive layer 40 is made up of a plurality of separate conductor strips 44 arranged in a pattern to make the necessary electrical connections. Conductor strips 44 are stamped pieces of electrically conductive metal and are substantially flat except for upwardly and downwardly bent tabs which constitute busbar terminals 32. Busbar terminals 32 extend perpendicularly from both the upper and lower surfaces of busbar 28 and project through apertures 36 into their respective receptacles 18, 20, 22 on upper and lower housing segments 24, 26.

Referring to FIG. 3, PCB 30 lies inside lower housing segment 26 and is positioned vertically by a ledge 50 formed around the periphery of the lower housing segment and by support bosses 52 projecting upwardly from the inside of the lower housing at appropriate positions. PCB mounting screws 54 pass through holes 30a in PCB 30 and thread into support bosses 52 to secure the PCB in its proper position inside of lower housing segment 26.

Circuit traces 56 are formed on both the upper and lower faces of PCB 30, and electronic components 58 (such as resistors, capacitors, integrated circuit chips, etc.) are soldered or otherwise electrically connected to the traces to form the circuits required for the control of various vehicle electrical systems. The current carried by circuit traces 56 is typically relatively low as compared with the levels of current carried by busbar conductive layers 40. Circuit traces 56 on both faces include solder pads 60, small areas of conductive material for allowing electrical connection with the circuit traces.

A plurality of upper PCB connection terminals 34 are positioned above PCB 30 to contact the upper face thereof, and a plurality of lower PCB connection terminals 134 are positioned below the PCB to contact the lower face. Each PCB connection terminal 34, 134 has a first end making contact with a solder pad 60 in a manner to be described in more detail hereinbelow, and a second end extending through an aperture 36 in its respective upper or lower housing segment 24, 26 and into a receptacle 18, 20, 22. In those areas of junction box 10 where busbar 28 lies between PCB 30 and upper housing segment 24, upper PCB connection terminals 34 pass through holes 62 in busbar 28 (see FIG. 2) before extending through apertures 36. Conductive layers 40 of busbar 28 are configured to avoid holes 62 so that upper PCB connection terminals 34 are electrically insulated from the current carried by the busbar as they pass therethrough. By passing through busbar 28, upper PCB connection terminals 34 permit electrical connection to be made with PCB 30 from the upper side of junction block 10 as well as the lower side, thereby providing greater flexibility in the layout of the junction block and the routing of wiring connecting thereto.

Although it is not strictly necessary for upper PCB connection terminals 34 to be identical to lower PCB connection terminals 134, such identity reduces the number of different parts required to construct a junction block 10 according to the present invention, and therefore is desirable for manufacturability reasons. Accordingly, the following description of upper PCB connection terminal 34 is also applicable to lower PCB terminal 134.

Figures 4, 5:
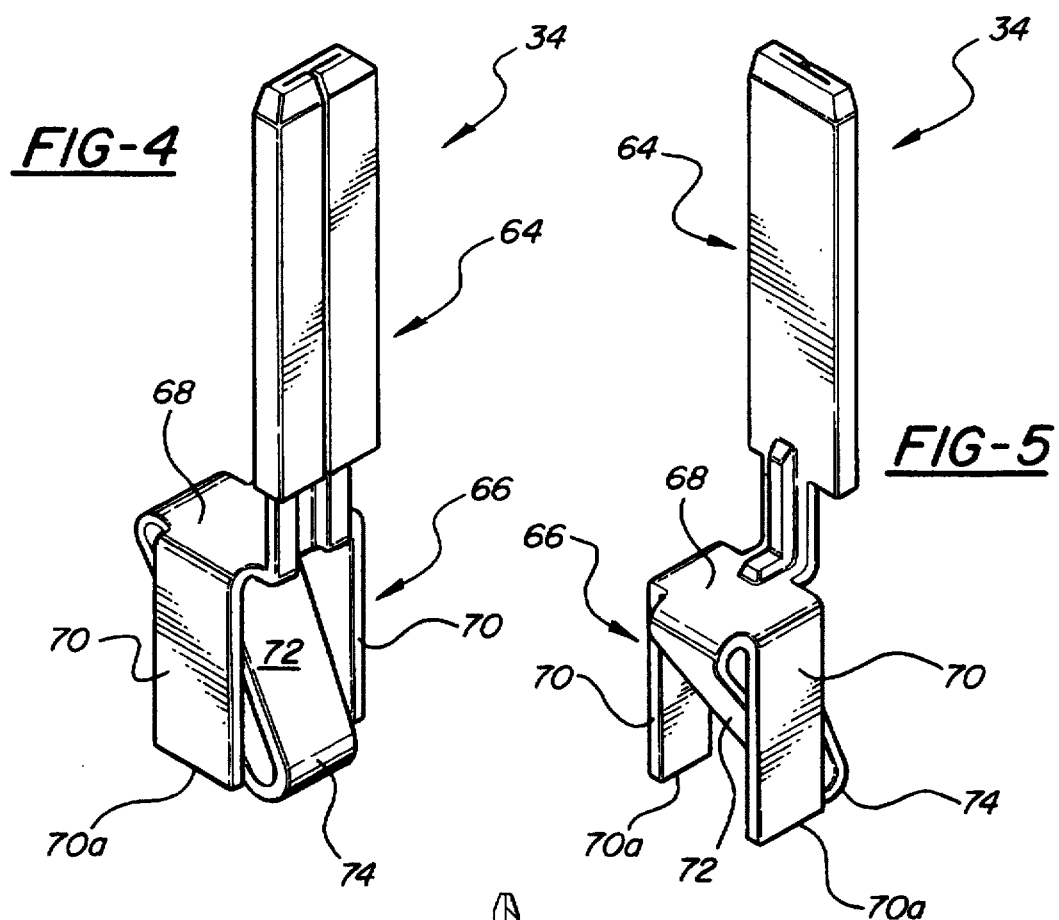
FIG. 4 is a perspective view of a printed circuit board connection terminal according to the present invention.
FIG. 5 is a second perspective view of the printed circuit board connection terminal of FIG. 4.
Figure 6:
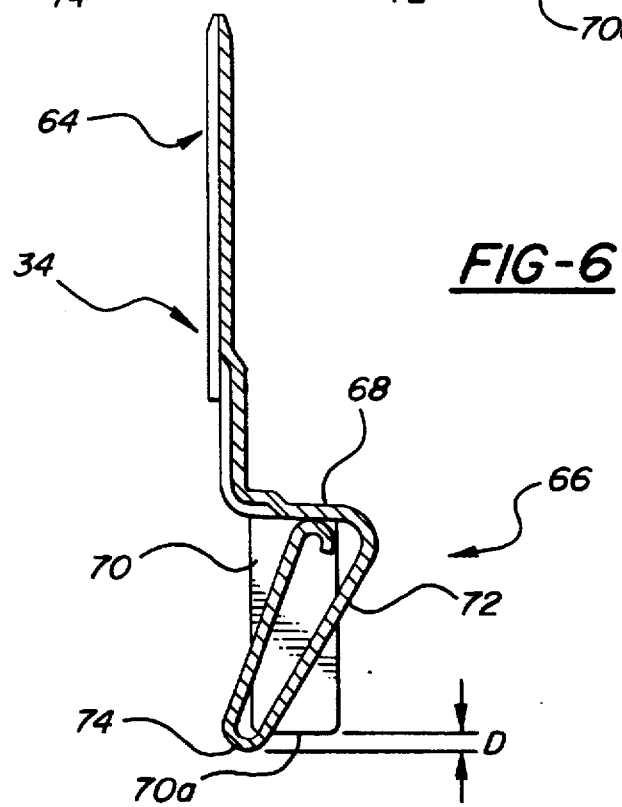
FIG. 6 is a partially cut away side view of the printed circuit board connection terminal of FIGS. 4 and 5.

As best seen in FIGS. 4–6, each PCB connection terminal 34 comprises a base portion 66 at a first end and an elongated, folded external connection end 64 at an opposite second end. Base portion 66 is made up of a top plate 68; a pair of rectangular, parallel side plates 70 extending in a direction substantially opposite to external connection end 64; and a spring member 72 located between the side plates. Spring member 72 extends downwardly at an angle from top plate 68 and is folded back upon itself to form a smoothly curved pressure contact end 74 adjacent to the lower ends of side plates 70. Pressure contact end 74 extends beyond the lower ends of the side plates by an amount labelled D in FIG. 6. PCB connection terminal 34 is preferably formed from a single piece of conductive metal such as copper by a manufacturing process utilizing conventional stamping and folding steps.

When PCB connection terminal 34 is positioned above a flat surface (not shown) and urged downwardly (as viewed in FIGS. 4–6) with force sufficient to overcome the resiliency of spring member 72, the spring member bends or deflects slightly to permit the flat lower edges 70a of side plates 70 to lie against the surface. The resiliency of spring member 72 and the magnitude of dimension D may be tailored such that when lower edges 70a are against a flat surface, pressure contact end 74 exerts a desired amount of force on the surface.

ASSEMBLY OF THE JUNCTION BLOCK

To assemble the invention junction block 10, an upper PCB connection terminal 34 is inserted through each hole 62 in busbar 28 so that external connection end 64 of each terminal extends through the busbar and top plate 68 lies substantially flush against the lower surface of the lowermost insulating layer 42. Terminal mating adapters 38 are then placed over external connection ends 64 and upwardly projecting busbar terminals 32 where required, and busbar 28 is inserted into upper housing segment 24 so that the external connection ends, the busbar terminals, and the mating adapters project through apertures 36 and into their respective receptacles 18, 20, 22.

Next, lower PCB connection terminals 134 are inserted through respective apertures 36 in lower housing segment 26 to position external connection ends 64 in connector receptacles 18 and base portions 66 on the inside of the lower housing segment. PCB 30 is then placed in position within lower housing segment 26 PCB to sandwich lower PCB connection terminals 134 between the PCB and the inner surface of lower housing segment 26, and mounting screws 54 are inserted through holes 30a and threaded into support bosses 52.

As is visible in FIG. 3, PCB connection terminal side plates 70 are of a length equal to the desired spacing between the lower face of PCB 30 and the inside surface of lower housing segment 26 against which the terminal top plates 68 bear when the terminals are inserted through apertures 36. Accordingly, when PCB 30 is positioned inside lower housing segment 26 on top of lower PCB connection terminals 34, it initially only touches the tips of pressure contact ends 74.

Tightening PCB mounting screws 54 into support bosses 52 urges PCB 30 toward lower housing segment 26 against the spring force of spring members 72 until the lower PCB face contacts the edges 70a of lower PCB connection terminal side plates 70, ledge 50 and support bosses 52. When PCB 30 is in this fully seated position, spring members 72 are deflected such that the dimension labelled D in FIG. 6 goes to zero. Solder pads 60 on PCB 30 and apertures 36 are in coordinated positions so that spring member pressure contact ends 74 touch their respective solder pads when PCB 30 fully seated and secured in place by PCB mounting screws 54, thus creating a pressure connection between the contact ends and the solder pads. The resiliency of spring member 72 and the magnitude of dimension D are tailored such that when side plate edges 70a are against the surface of PCB 30, pressure contact end 74 exerts the proper amount of force to ensure good electrical contact with solder pad 60. The smooth curvature of contact ends 74 reduces the likelihood that solder pads 60 will be damaged by any relative movement between PCB connection terminals 34 and the solder pads during assembly or disassembly of junction block 10.

Once busbar 28 and PCB 30 are positioned in upper and lower housing segments 24, 26 respectively, the housing segments are mated to one another with lower housing segment 26 fitting inside of a skirt 76 projecting downward from upper housing segment 24 around substantially its entire periphery (see FIG. 3). A connecting screw 78 passes through a hole in a support boss 52 of the lower housing segment 26 and engages a mating threaded hole 79 in upper housing segment 24 to secure the segments together.

When upper and lower housing segments 24, 26 are mated, base portions 66 of upper PCB connection terminals 34 are sandwiched between busbar 28 and PCB 30, and contact ends 74 of spring members 72 are in alignment with solder pads 60 on the upper face of PCB 30. As is apparent in FIG. 3, PCB connection terminal side plates 70 are of a length equal to the desired spacing between the upper face of PCB 30 and the lower surface of busbar 28 so that when the housing segments are urged together by tightening of connecting screw 78 spring members 72 deflect slightly and pressure contact ends 74 are urged into a pressure connection with the solder pads.

By positioning PCB 30 within the junction block housing and supplying it with electric power from a wiring connecter 12 rather than busbar 28, the number of components and electrical interfaces required to distribute electrical power to the vehicle systems and connect them with electronic control circuits is reduced. Also, the busbar need not contain an additional conductive layer for carrying the level of electrical current required by PCB 30, and so is made thinner and less difficult and expensive to construct.

Since upper PCB connection terminals 34 pass through busbar 28, electrical connection may be made with PCB 30 from the upper side of junction block 10 as well as the lower side, thereby providing greater flexibility in the layout of the junction block and the routing of wiring. PCB connection terminals 34 also serve to maintain PCB 30 and the busbar 28 the proper distance apart, and the spring action of the terminals ensures good electrical contact with the PCB solder pads 60.

Whereas a preferred embodiment of the invention has been illustrated and described in detail, it will be apparent that various changes may be made in the disclosed embodiment without departing from the scope or spirit of the invention.

I claim:

1. An electrical junction block comprising:

a housing having first and second housing segments;

a substantially planar, multi-layer busbar enclosed within the housing; and a printed circuit board enclosed within the housing adjacent to and substantially parallel with the busbar, the printed circuit board and the busbar being electrically insulated from one another and having electrical terminals extending outside the housing, and the printed circuit board receiving electric power from a source other than the busbar.

2. An electrical junction block comprising:

a housing having first and second housing segments;

a substantially planar, multi-layer busbar retained within the housing adjacent the first housing segment; and a printed circuit board retained within the housing adjacent the second housing segment and substantially parallel with the busbar, the printed circuit board and the busbar being electrically insulated from one another and having electrical terminals extending outside the housing;

wherein the printed circuit board has at least one circuit trace disposed on a face thereof oriented toward the first housing segment and the busbar has a hole passing therethrough, and the junction block further comprises at least one printed circuit board connection terminal passing through the hole in the busbar and having a first end electrically connected with the circuit trace and a second end adjacent an aperture in the first housing segment and adapted for making electrical connection with a component external to the housing.

3. An electrical junction block according to claim 2 wherein the electrical connection between the first end of the printed circuit board connection terminal and the circuit trace is a pressure connection.

4. An electrical junction block according to claim 3 wherein the first end of the printed circuit board connection terminal comprises a spring member, the spring member deflectable when urged into contact with the circuit trace to thereby provide the pressure connection.

5. An electrical junction block according to claim 4 wherein the printed circuit board connection terminal further comprises spacer means adjacent the first end of the printed circuit board connection terminal, the spacer means sandwiched between the busbar and the printed circuit board and maintaining a desired separation distance between the busbar and the printed circuit board in the vicinity of the printed circuit board connection terminal.

6. An electrical junction block according to claim 5 wherein the spacer means has a length substantially equal to the desired separation distance and the spring member has an undeflected condition wherein it extends beyond the desired separation distance such that sandwiching the spacer means between the busbar and the printed circuit board compresses the spring member and urges the spring member into contact with the circuit trace.

7. An electrical junction block according to claim 2 wherein the printed circuit board has a second face opposite the first face, and the junction block further comprises at least one second printed circuit board connection terminal having a first end in electrical contact with at least one circuit trace on the second face of the printed circuit board and a second end adjacent an aperture in the second housing segment and adapted for making electrical connection with a second component external to the housing.

8. An electrical junction block according to claim 7 wherein the electrical connection between the first end of the second printed circuit board connection terminal and the circuit trace on the second face of the printed circuit board is a pressure connection.

9. An electrical junction block comprising:

a housing having first and second housing segments;

a busbar retained within the housing adjacent the first housing segment and having a hole passing therethrough;

a printed circuit board retained within the housing adjacent the second housing segment and having a first face oriented toward the first housing segment, the first face having circuit traces formed thereon; and at least one printed circuit board connection terminal passing through the hole in the busbar and having a first end in electrical connection with at least one of the circuit traces, and a second end adjacent an aperture in the first housing segment and adapted for making electrical connection with a component external to the housing.

10. For use in an electrical junction block containing a printed circuit board and a busbar in spaced relationship with one another, an electrical terminal comprising:

substantially rigid spacer means disposable between and in contact with a face of the printed circuit board oriented toward the busbar and a face of the busbar oriented toward the printed circuit board to maintain a desired separation distance therebetween;

spring means urgeable to a deflected condition when the printed circuit board and the busbar are at the desired separation distance, the spring means when in the deflected condition being in physical and electrical contact with electrically conductive means on the face of the printed circuit board; and an external connection end electrically connected with the spring means and insertable through a hole in the busbar for making electrical contact with a component located adjacent an opposite second face of the busbar.

11. An electrical terminal according to claim 10 wherein the spacer means comprises a pair of substantially parallel plates having lengths equal to the desired separation distance, the plates positionable between and substantially perpendicularly to the adjacent faces of the printed circuit board and the busbar.

12. An electrical terminal according to claim 11 wherein the spring means is disposed between the plates and has a folded end for contacting the electrically conductive means.

13. An electrical junction block comprising:

a housing having first and second housing segments;

a busbar contained within the housing adjacent the first housing segment and having a hole passing therethrough;

a printed circuit board contained within the housing adjacent the second housing segment in substantially parallel spaced relationship to the busbar, the printed circuit board having circuit traces formed on opposite first and second faces thereof;

at least one first printed circuit board connection terminal having an external connection end disposed adjacent an aperture in the first housing segment, a pair of spacer plates disposed between and in contact with adjacent faces of the busbar and the printed circuit board, and a spring element in electrical connection with at least one of the circuit traces on the first face of the printed circuit board, the printed circuit board connection terminal passing through the hole in the busbar; and at least one second printed circuit board connection terminal having an external connection end disposed adjacent an aperture in the second housing segment and a spring element in electrical connection with at least one of the circuit traces on the second face of the printed circuit board.

* * * * *